(12) United States Patent
Hui et al.

(10) Patent No.: US 7,432,178 B2
(45) Date of Patent: Oct. 7, 2008

(54) BIT LINE IMPLANT

(75) Inventors: Angela T. Hui, Fremont, CA (US); Jean Yang, Sunnyvale, CA (US); Yu Sun, Saratoga, CA (US); Mark T. Ramsbey, Sunnyvale, CA (US); Weidong Qian, Sunnyvale, CA (US)

(73) Assignees: Advanced Micro Devices, Inc., Sunnyvale, CA (US); Spansion LLC, Sunnyvale, CA (US)

( * ) Notice: Subject to any disclaimer, the term of this patent is extended or adjusted under 35 U.S.C. 154(b) by 390 days.

(21) Appl. No.: 11/254,769

(22) Filed: Oct. 21, 2005

(65) Prior Publication Data

US 2007/0093042 A1  Apr. 26, 2007

(51) Int. Cl.
*H01L 21/04* (2006.01)
(52) U.S. Cl. .............................. 438/510; 257/E21.657; 257/E21.679
(58) Field of Classification Search ................. 438/510; 257/E21.657
See application file for complete search history.

(56) References Cited

U.S. PATENT DOCUMENTS

| | | | |
|---|---|---|---|
| 5,032,881 A * | 7/1991 | Sardo et al. ................. 257/316 |
| 5,416,349 A * | 5/1995 | Bergemont ................. 257/316 |
| 5,753,557 A | 5/1998 | Tseng | |
| 6,171,940 B1 | 1/2001 | Huang | |
| 6,576,562 B2 | 6/2003 | Ohuchi et al. | |
| 6,605,541 B1 | 8/2003 | Yu | |
| 6,607,955 B2 | 8/2003 | Lee | |
| 6,620,741 B1 | 9/2003 | Gracias et al. | |
| 6,764,903 B1 | 7/2004 | Chan et al. | |
| 6,797,565 B1 | 9/2004 | Yang et al. | |
| 6,803,284 B2 * | 10/2004 | Hwang ........................ 438/275 |
| 6,864,556 B1 | 3/2005 | You et al. | |
| 6,927,145 B1 | 8/2005 | Yang et al. | |
| 7,037,850 B2 | 5/2006 | Lee et al. | |
| 2002/0086547 A1 | 7/2002 | Mui et al. | |
| 2002/0132430 A1* | 9/2002 | Willer et al. ................. 438/262 |
| 2003/0096503 A1 | 5/2003 | Cho et al. | |
| 2004/0005778 A1 | 1/2004 | Kronke et al. | |

(Continued)

FOREIGN PATENT DOCUMENTS

DE   101 10 150 A1   9/2002

(Continued)

OTHER PUBLICATIONS

2002 IEEE International Solid-State Circuits Conference, Session 6, "SRAM and Non-Volatile Memories," Feb. 4, 2004, 6 pages.

(Continued)

*Primary Examiner*—Asok K Sarkar
(74) *Attorney, Agent, or Firm*—Harrity Snyder, LLP

(57) ABSTRACT

A method for performing a bit line implant is disclosed. The method includes forming a group of structures on an oxide-nitride-oxide stack of a semiconductor device. Each structure of the group of structures includes a polysilicon portion and a hard mask portion. A first structure of the group of structures is separated from a second structure of the group of structures by less than 100 nanometers. The method further includes using the first structure and the second structure to isolate a portion of the semiconductor device for the bit line implant.

13 Claims, 18 Drawing Sheets

U.S. PATENT DOCUMENTS

| | | |
|---|---|---|
| 2004/0058518 A1 | 3/2004 | Fang et al. |
| 2005/0136630 A1 | 6/2005 | Kim |
| 2005/0212035 A1 | 9/2005 | Utsuno et al. |
| 2006/0030151 A1 | 2/2006 | Ding et al. |
| 2006/0154477 A1 | 7/2006 | Geng et al. |
| 2006/0264002 A1 | 11/2006 | Tran et al. |

FOREIGN PATENT DOCUMENTS

| | | |
|---|---|---|
| EP | 1 170 800 A2 | 1/2002 |

OTHER PUBLICATIONS

2002 IEEE International Solid-State Circuits Conference, 23 pages.

* cited by examiner

BIT LINE IMPLANT

FIELD OF THE INVENTION

Implementations consistent with the principles of the invention relate generally to semiconductor manufacturing and, more particularly, to forming bit line implants.

BACKGROUND OF THE INVENTION

The escalating demands for high density and performance associated with non-volatile memory devices require small design features, high reliability and increased manufacturing throughput. The reduction of design features, however, challenges the limitations of conventional methodology.

For example, it is desirable to decrease the effective channel length in a semiconductor device. The initial distance between the source-side junction and the drain-side junction of a semiconductor device is often referred to as the physical channel length. However, after implantation and subsequent diffusion of the junctions, the actual distance between junctions becomes less than the physical channel length and is often referred to as the effective channel length. Decreasing the effective channel length reduces the distance between the depletion regions associated with the source and drain of a semiconductor device. As a result, less gate charge is required to invert the channel of a semiconductor device having a short effective channel length, resulting in faster switching speeds.

SUMMARY OF THE INVENTION

In an implementation consistent with the principles of the invention, a method for performing a bit line implant is provided. The method includes forming a group of structures on an oxide-nitride-oxide stack of a semiconductor device. Each structure of the group of structures includes a polysilicon portion and a hard mask portion. A first structure of the group of structures is separated from a second structure of the group of structures by less than 100 nanometers. The method further includes using the first structure and the second structure to isolate a portion of the semiconductor device for the bit line implant.

In another implementation consistent with the principles of the invention, a method includes forming a first structure and a second structure on a number of layers of a semiconductor device, where the first structure and the second structure includes a polysilicon portion and a hard mask portion. The method further includes implanting a dopant at a dosage ranging from about $1 \times 10^{12}$ atoms/cm$^2$ to about $1 \times 10^{15}$ atoms/cm$^2$ and an implantation energy ranging from about 5 KeV to about 30 KeV between the first structure and the second structure.

In yet another implementation consistent with the principles of the invention, a semiconductor device includes an oxide-nitride-oxide stack formed on a substrate; a first conductive layer formed on the oxide-nitride-oxide stack, the first conductive layer serving as a bit line implant blocker; and a second conductive layer formed on the first conductive layer, the second conductive layer serving as a word line.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Exemplary Processing

Figure 1:
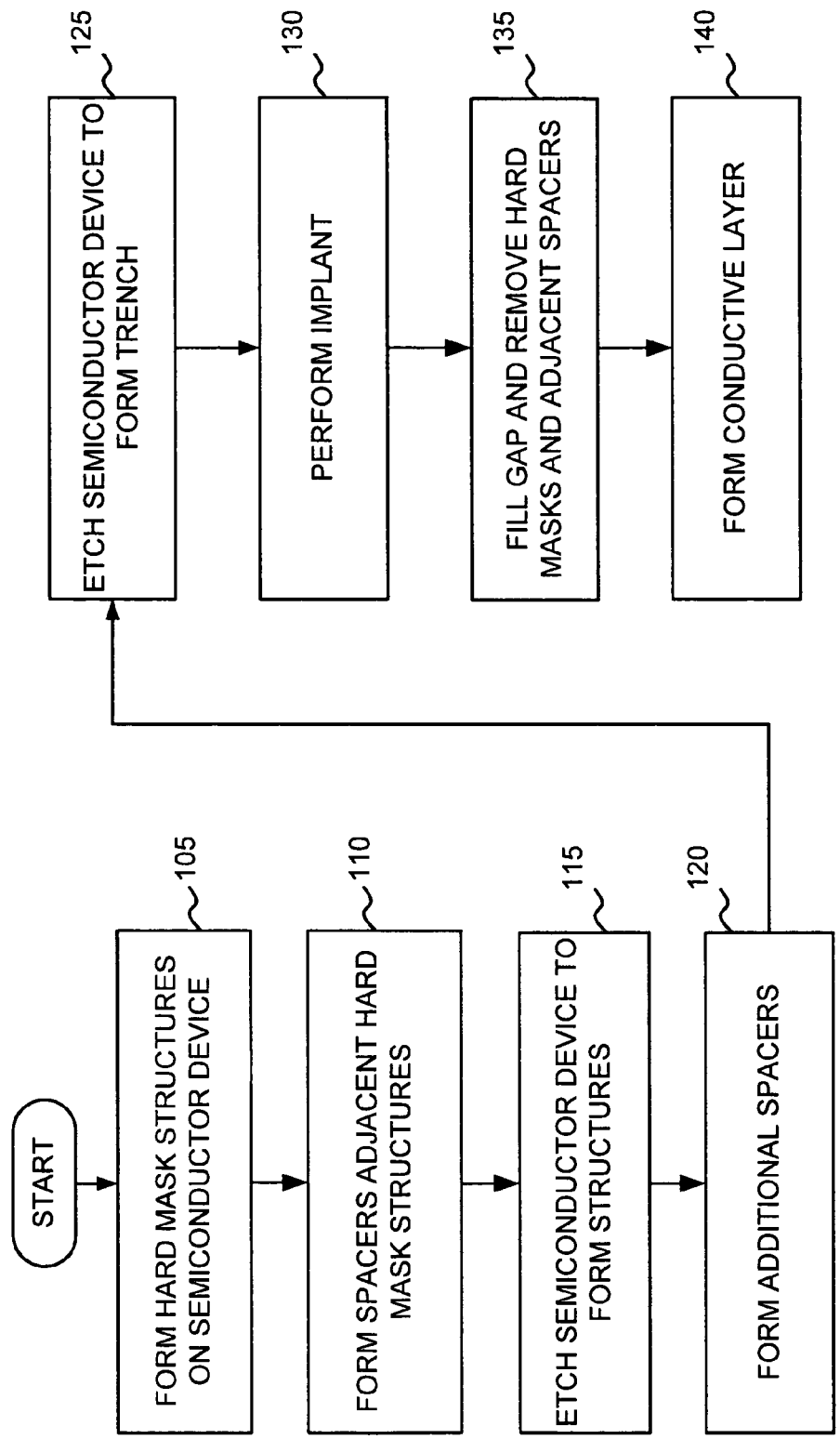
FIG. 1 illustrates an exemplary process for forming a semiconductor memory device in an implementation consistent with the principles of the invention.

FIG. 1 illustrates an exemplary process for forming a semiconductor device in an implementation consistent with the principles of the invention. In one implementation, the semiconductor device may include a flash memory device, such as an electrically erasable programmable read only memory (EEPROM) device. FIGS. 2-10 illustrate exemplary views of a semiconductor device fabricated according to the processing described in FIG. 1.

Figure 2:
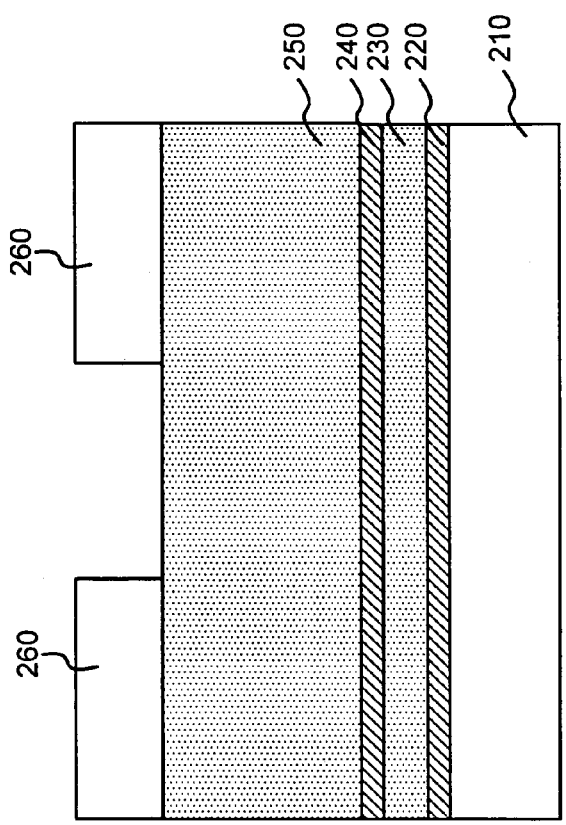
FIGS. 2-10 illustrate exemplary views of a semiconductor device fabricated according to the processing described in FIG. 1.

With reference to FIGS. 1 and 2, processing may begin with a semiconductor device 200 that includes layers 210, 220, 230, 240, and 250. In an exemplary embodiment, layer 210 may be a substrate of semiconductor device 200 and may include silicon, germanium, silicon-germanium, or other semiconducting materials. In alternative implementations, layer 210 may be a conductive layer or a dielectric layer formed a number of layers above the surface of a substrate in semiconductor device 200.

Layer 220 may be a dielectric layer formed on layer 210 in a conventional manner. In an exemplary implementation, dielectric layer 220 may include an oxide, such as a silicon oxide (e.g., SiO$_2$), and may have a thickness ranging from about 30 Å to about 100 Å. Dielectric layer 220 may function as a tunnel oxide layer for a subsequently formed memory cell of semiconductor device 200.

Layer 230 may be formed on layer 220 in a conventional manner and may include a dielectric material, such as a nitride (e.g., a silicon nitride) or an oxynitride. Layer 230, consistent with the invention, may act as a charge storage layer for semiconductor device 200 and may have a thickness ranging from about 30 Å to about 100 Å. In alternative implementations, layer 230 may include a conductive material, such as polycrystalline silicon, used to form a floating gate electrode.

Layer 240 may be formed on layer 230 in a conventional manner and may include a dielectric material, such as an oxide (e.g., SiO$_2$). Alternatively, layer 240 may include a material having a high dielectric constant (K), such as Al$_2$O$_3$ or HfO$_2$, that may be deposited or thermally grown on layer 230. In still other alternatives, layer 240 may be a composite that includes a number of dielectric layers or films. Layer 240 may have a thickness ranging from about 30 Å to about 100 Å and may function as an inter-gate dielectric for memory cells in semiconductor device 200.

In one exemplary implementation consistent with the invention, layers 220-240 may act as an oxide-nitride-oxide (ONO) stack for a SONOS-type memory cell, with nitride layer 230 acting as a charge storage layer and the ONO stack being formed on a silicon substrate 210.

Layer 250 may include a conductive material, such as polycrystalline silicon, formed on layer 240 in a conventional manner. Alternatively, layer 250 may include other semiconducting materials, such as germanium or silicon-germanium, or various metals, such as titanium or tungsten. Layer 250, consistent with an implementation of the invention, may serve as a control gate or part of a control gate for semiconductor device 200. Layer 250 may also serve as an implant blocker for a bit line implant of semiconductor device 200. In an exemplary implementation, layer 250 may have a thickness ranging from about 500 Å to about 1,200 Å.

A hard mask layer may be patterned and etched to form hard mask structures 260 on the top surface of layer 250, as illustrated in FIG. 2 (act 105). In one implementation, hard mask layer may be formed to a thickness ranging from about 400 Å to about 1,000 Å and may include a dielectric material, such as silicon rich nitride (SiRN), a silicon nitride (e.g., $Si_3N_4$), silicon oxynitride (SiON), etc. Hard mask structures 260 may be used to facilitate etching of layer 250, as described in more detail below. In one implementation, hard mask structures 260 may be formed to a width ranging from about 400 Å to about 1,000 Å.

Figure 3:
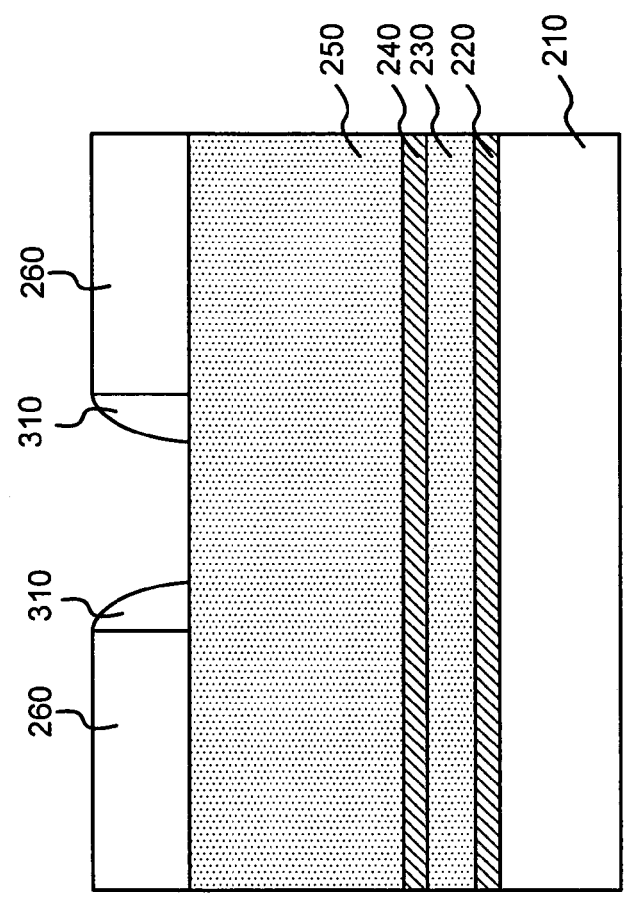

Spacers 310 may be formed adjacent the sidewalls of hard mask structures 260, as illustrated in FIG. 3 (act 110). For example, a dielectric material, such as a silicon oxide, a silicon rich nitride, a silicon nitride, a silicon oxynitride, or another dielectric material, may be deposited and etched to form spacers 310 on the side surfaces of hard mask structures 260, as illustrated in FIG. 3. Spacers 310 may be used for etching layer 250, as will be described below.

Figure 4:
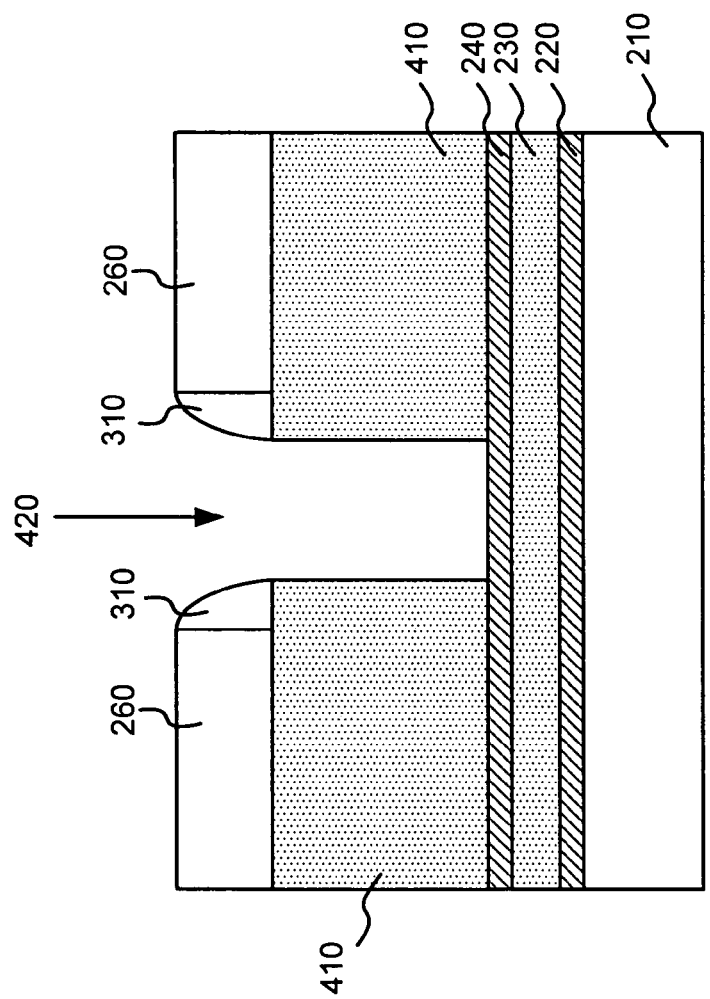

Semiconductor device 200 may then be etched, as illustrated in FIG. 4 (act 115). Referring to FIG. 4, layer 250 may be etched in a conventional manner with the etching terminating at layer 240, thereby forming structures 410. Each structure 410 may be formed to a width ranging from about 1,000 Å to about 1,800 Å. In an implementation consistent with the principles of the invention, a gap (or trench) 420 formed between structures 410 may range from about 500 Å to about 1,000 Å in width. In one implementation, gap 420 may be formed to a width of less than 100 nanometers (nm), such as approximately 90 nm.

Figure 5:
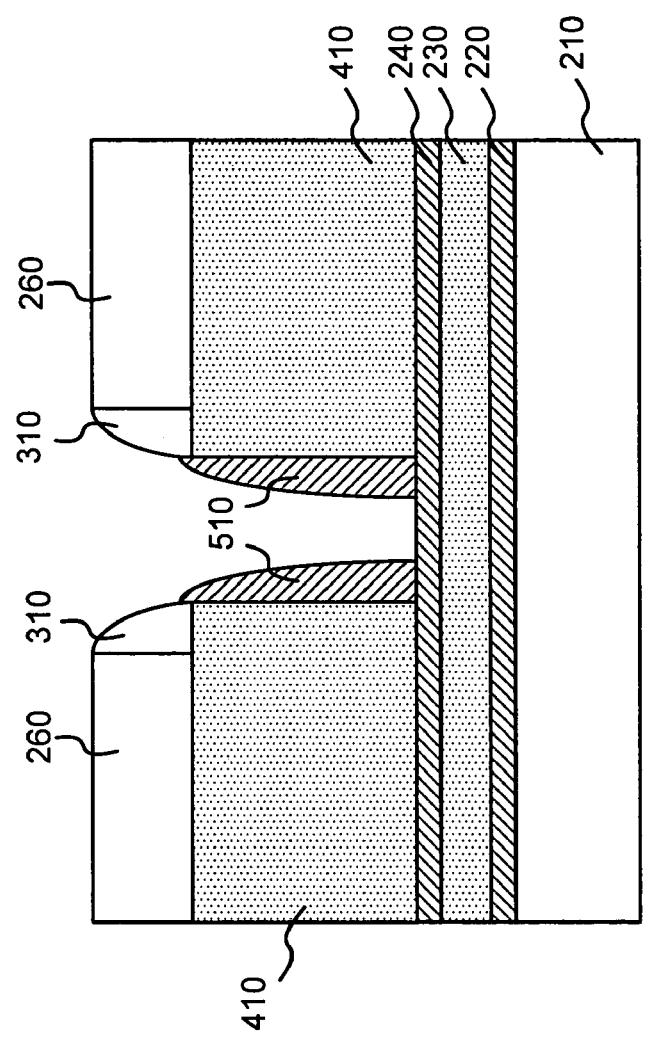

Spacers 510 may be formed adjacent the sidewalls of structures 410, as illustrated in FIG. 5 (act 120). For example, a dielectric material, such as an oxide or a nitride, may be deposited and etched to form spacers 510 on the side surfaces of structures 410, as illustrated in FIG. 5. In another implementation, another material may be used for forming spacers 510, such as a dielectric material (e.g., a silicon oxide, a silicon nitride, etc.). Each spacer 510 may be formed to a width ranging from about 100 Å to about 250 Å. Spacers 510 may be used for etching layers 240-220, as will be described below.

Figure 6:
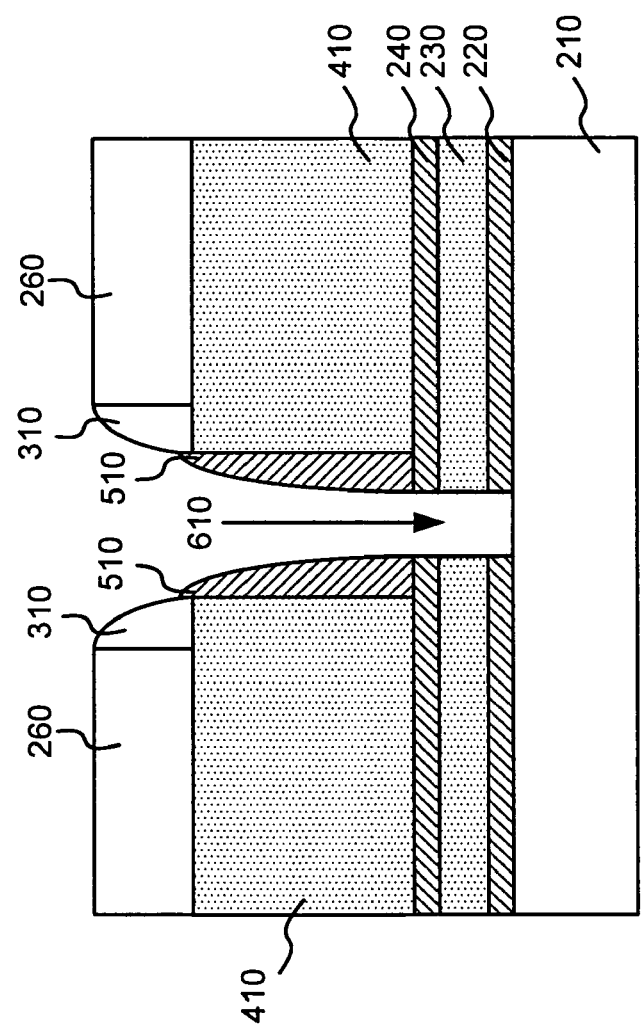

Semiconductor device 200 may then be etched, as illustrated in FIG. 6 (act 125). Referring to FIG. 6, structures 410 and spacers 510 may be used to protect portions of layers 220-240 from being etched while a trench 610 is formed in layers 220-240. The etching may be performed in a conventional manner with the etching terminating at layer 210. In an implementation consistent with the principles of the invention, trench 610 may be formed in layers 220-240 to a width ranging from about 40 nm to about 70 nm. In one implementation, trench 610 may be formed to a width of approximately 40 nm to 50 nm.

Figure 7:
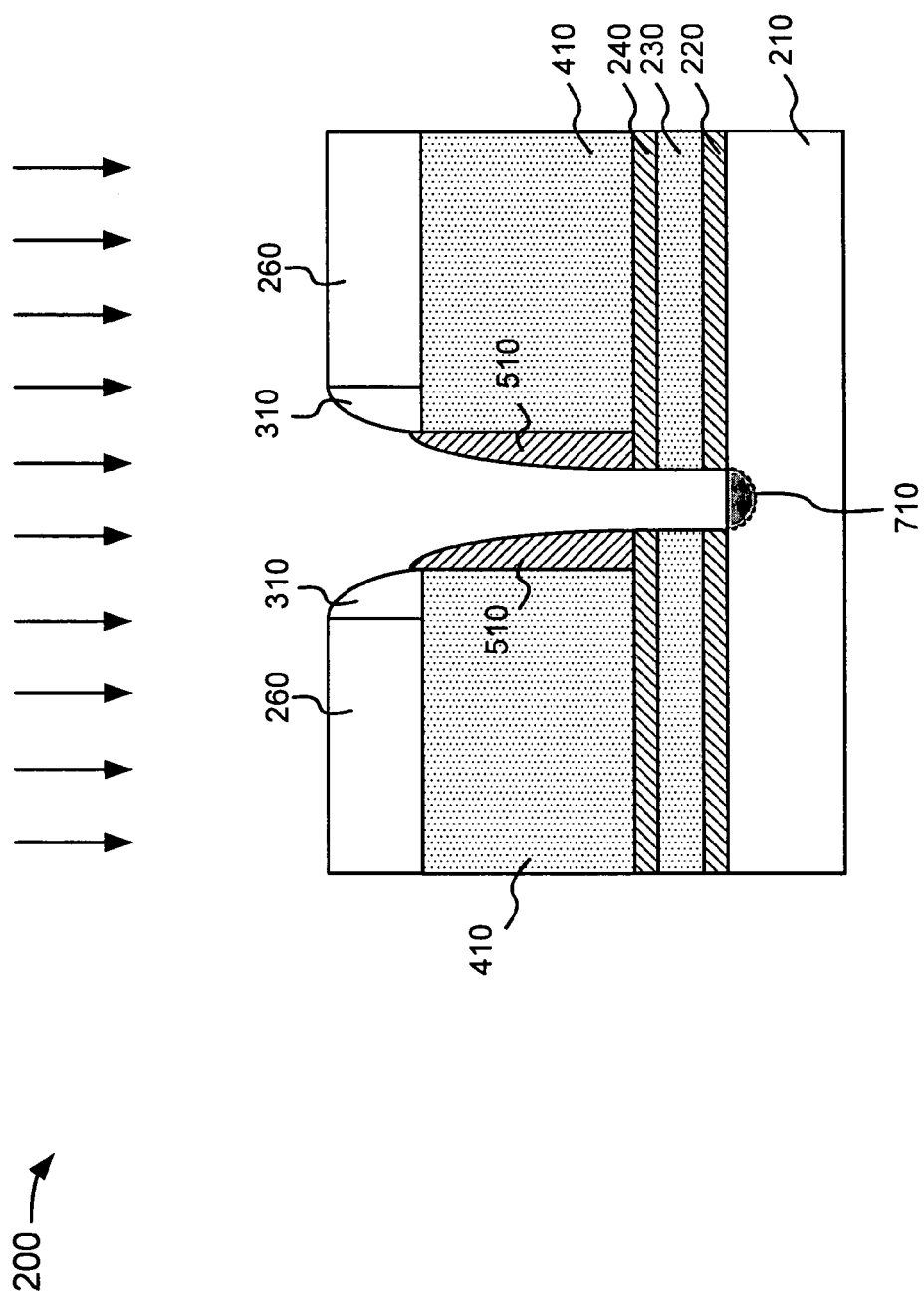

A bit line implant may be performed, as illustrated in FIG. 7, to form bit line 710 (act 130). In one implementation, bit line 710 may be formed by a main perpendicular implant process into substrate 210. Unlike conventional implant processes, the implant process, according to an exemplary implementation consistent with the principles of the invention, may be performed as a lower concentration implant since the upper portion of substrate 210 is exposed. For example, in one implementation, a p-type dopant, such as boron, may be used as the dopant. An n-type dopant, such as arsenic or phosphorous, may be used as the dopant. The n-type dopant atoms may be implanted at a dosage of about $1\times10^{12}$ atoms/$cm^2$ to about $1\times10^{15}$ atoms/$cm^2$ and an implantation energy of about 5 KeV to about 30 KeV, which may depend on the desired junction depth for bit line 710.

Figure 8:
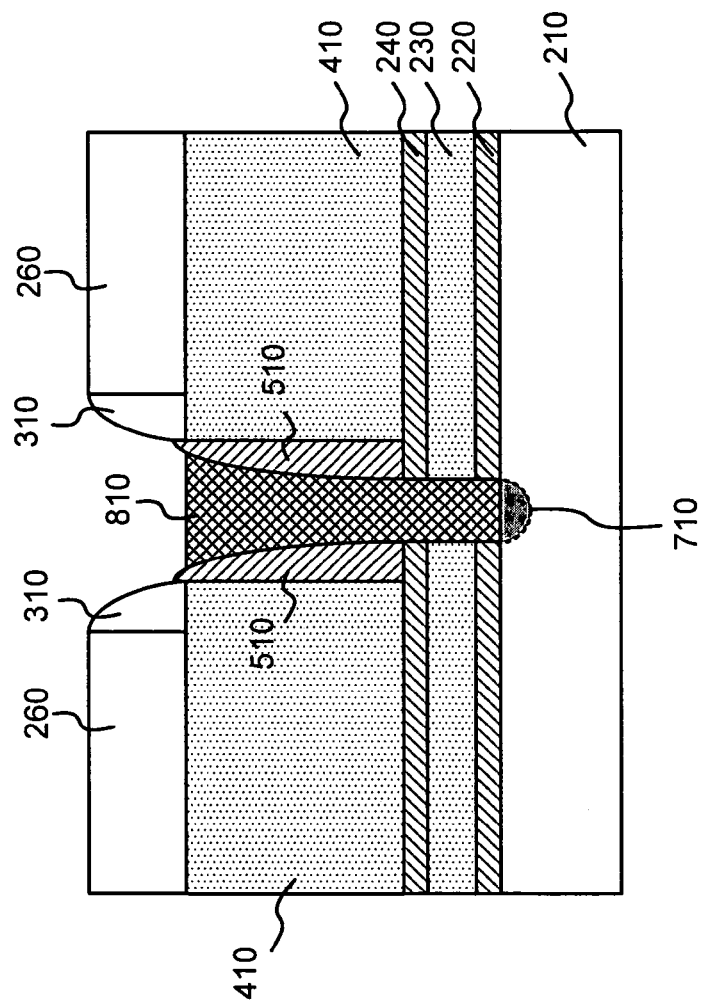
Figure 9:
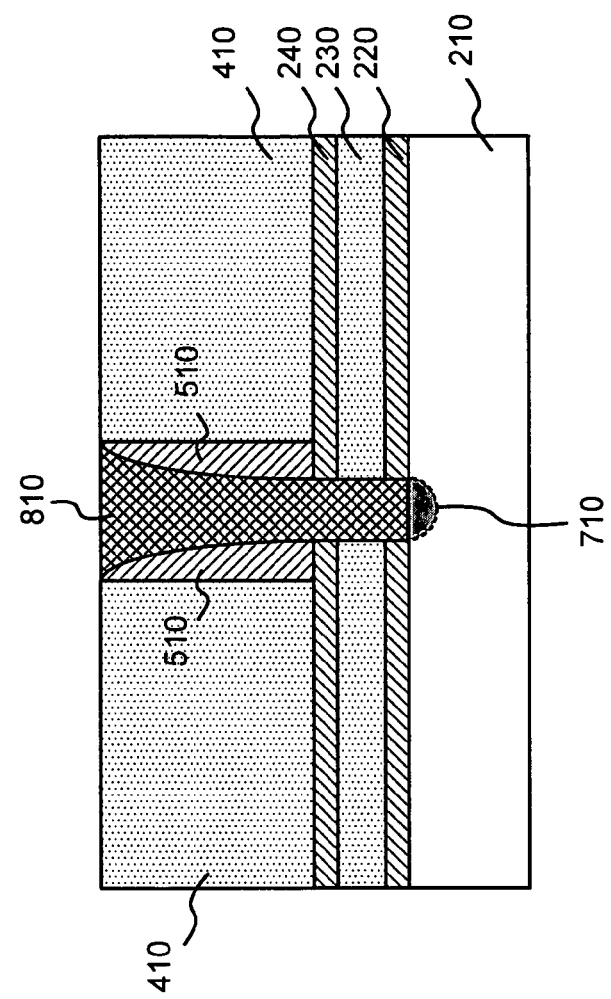

Following the bit line implant, trench 610, formed in layers 220-240, and gap 420, formed between structures 410, may be filled with a material 810, as illustrated in FIG. 8 (act 135). In one implementation, material 810 may include a high density plasma (HDP) oxide or another dielectric material. Material 810 may be polished back to the top surface of structures 410. Hard mask structures 260 and spacers 310 may be removed, as illustrated in FIG. 9 (act 135).

Figure 10:
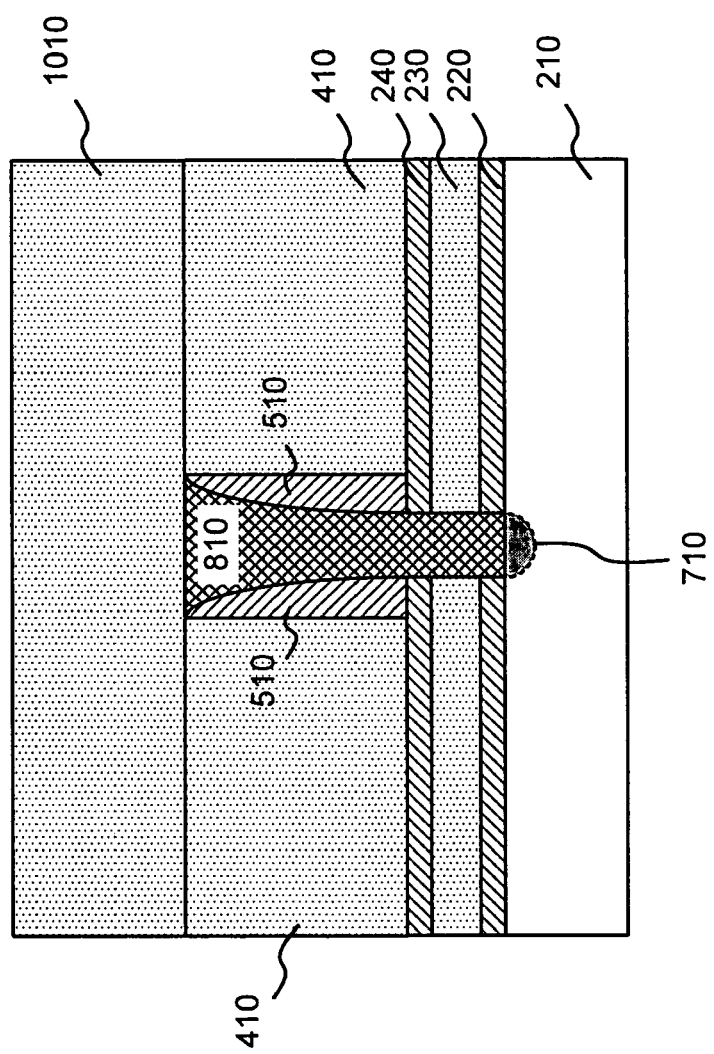

A conductive layer 1010 may be formed on a top surface of semiconductor device 200 in a conventional manner, as illustrated in FIG. 10 (act 140). In one implementation consistent with the principles of the invention, the conductive material may include polycrystalline silicon. Alternatively, layer 1010 may include other semiconducting materials, such as germanium or silicon-germanium, or various metals, such as titanium or tungsten. Layer 1010, consistent with an implementation of the invention, may serve as a word line for semiconductor device 200. In an exemplary implementation, layer 1010 may be formed to a thickness ranging from about 800 Å to about 1,200 Å. An optional silicide layer, such as titanium silicide (not shown), may be formed on layer 1010.

Various back end of line (BEOL) processing may be performed to complete the fabrication of semiconductor device 200. For example, one or more inter-layer dielectrics (ILDs), conductive lines, and contacts may be formed in semiconductor device 200. A top dielectric layer, also referred to as cap layer, may be formed over the top most conductive layer and may act as a protective layer to prevent damage to semiconductor device 200, such as to protect against impurity contamination during subsequent cleaning processes that may be used to complete a working memory device. The working memory device may include a large number of memory cells, where each memory cell is able to store one or more bits of information. For example, charge storage layer 230 for each memory cell may store 2 or more charges by localizing charges caused by electrons tunneling into layer 230 during programming. In this manner, the density of semiconductor device 200 may be increased.

Figure 11:
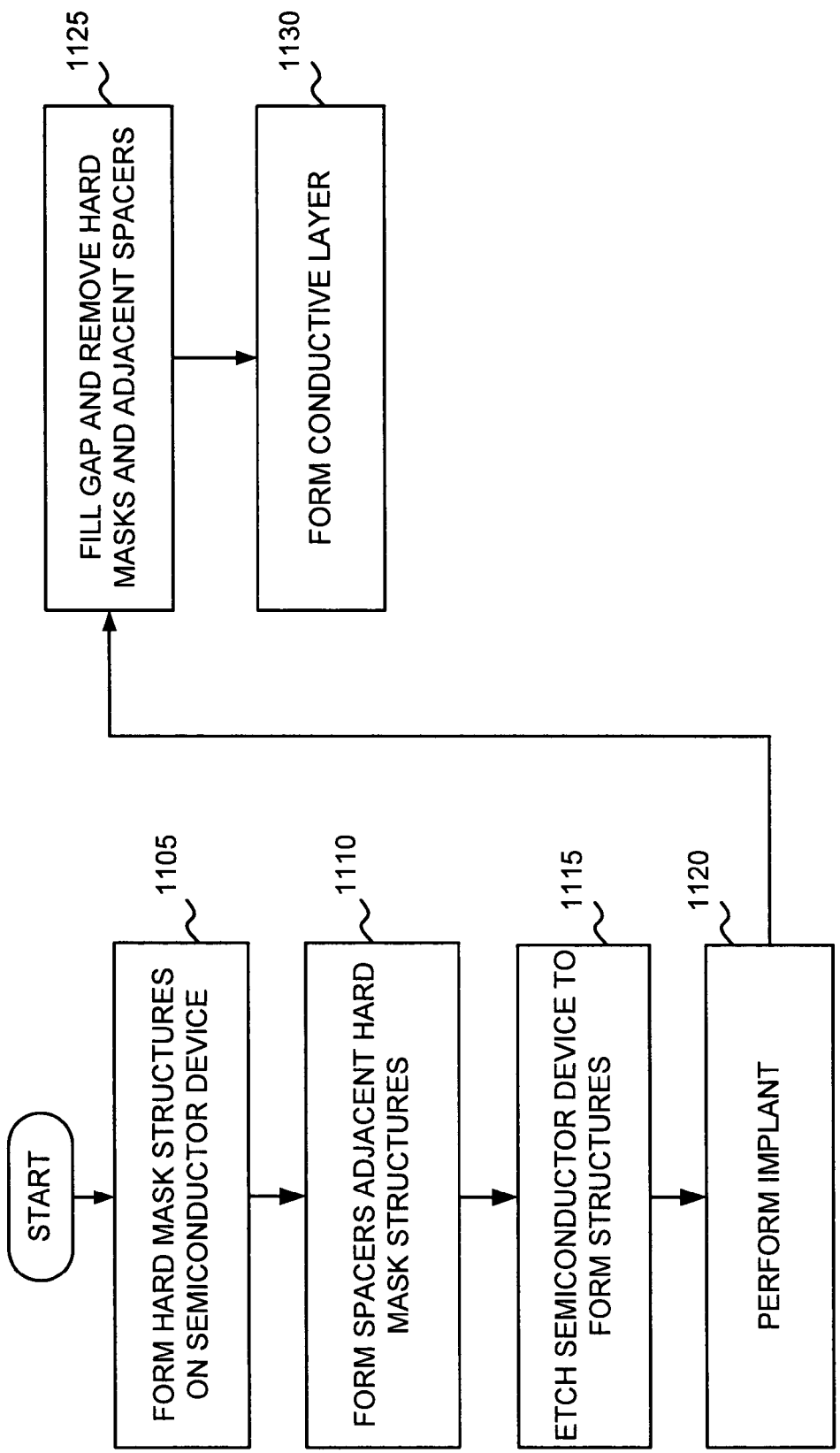
FIG. 11 illustrates another exemplary process for forming a semiconductor memory device in an implementation consistent with the principles of the invention.

FIG. 11 illustrates another exemplary process for forming a semiconductor device in an implementation consistent with the principles of the invention. In one implementation, the semiconductor device may include a flash memory device, such as an EEPROM device. FIGS. 12-18 illustrate exemplary views of a semiconductor device fabricated according to the processing described in FIG. 11.

Figure 12:
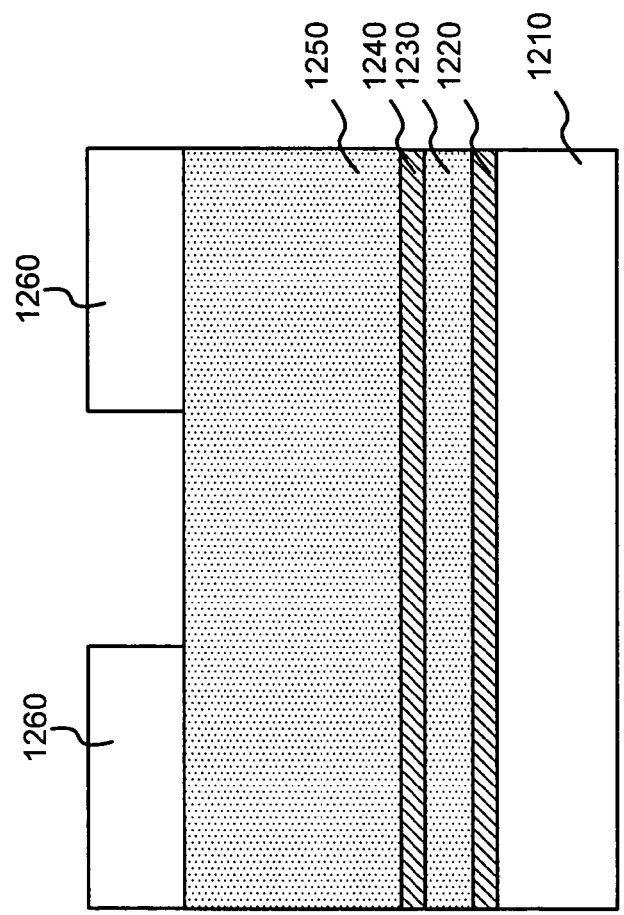
FIGS. 12-18 illustrate exemplary views of a semiconductor device fabricated according to the processing described in FIG. 11.

With reference to FIGS. 11 and 12, processing may begin with a semiconductor device 1200 that includes layers 1210, 1220, 1230, 1240, and 1250. In an exemplary embodiment, layer 1210 may be a substrate of semiconductor device 1200 and may include silicon, germanium, silicon-germanium, or other semiconducting materials. In alternative implementations, layer 1210 may be a conductive layer or a dielectric layer formed a number of layers above the surface of a substrate in semiconductor device 1200.

Layer 1220 may be a dielectric layer formed on layer 1210 in a conventional manner. In an exemplary implementation, dielectric layer 1220 may include an oxide, such as a silicon oxide (e.g., $SiO_2$), and may have a thickness ranging from about 30 Å to about 100 Å. Dielectric layer 1220 may function as a tunnel oxide layer for a subsequently formed memory cell of semiconductor device 1200.

Layer 1230 may be formed on layer 1220 in a conventional manner and may include a dielectric material, such as a nitride (e.g., a silicon nitride) or an oxynitride. Layer 1230, consistent with the invention, may act as a charge storage layer for semiconductor device 1200 and may have a thickness ranging from about 30 Å to about 100 Å. In alternative implementations, layer 1230 may include a conductive material, such as polycrystalline silicon, used to form a floating gate electrode.

Layer 1240 may be formed on layer 1230 in a conventional manner and may include a dielectric material, such as an oxide (e.g., $SiO_2$). Alternatively, layer 1240 may include a material having a high dielectric constant (K), such as $Al_2O_3$ or $HfO_2$, that may be deposited or thermally grown on layer 1230. In still other alternatives, layer 1240 may be a composite that includes a number of dielectric layers or films. Layer 1240 may have a thickness ranging from about 30 Å to about 100 Å and may function as an inter-gate dielectric for memory cells in semiconductor device 1200.

In one exemplary implementation consistent with the invention, layers 1220-1240 may act as an ONO stack for a SONOS-type memory cell, with nitride layer 1230 acting as a charge storage layer and the ONO stack being formed on a silicon substrate 1210.

Layer 1250 may include a conductive material, such as polycrystalline silicon, formed on layer 1240 in a conventional manner. Alternatively, layer 1250 may include other semiconducting materials, such as germanium or silicon-germanium, or various metals, such as titanium or tungsten. Layer 1250, consistent with an implementation of the invention, may serve as a control gate or a portion of a control gate for semiconductor device 1200. Layer 1250 may also serve as an implant blocker for a bit line implant of semiconductor device 1200. In an exemplary implementation, layer 1250 may have a thickness ranging from about 500 Å to about 1,200 Å.

A hard mask layer may be patterned and etched to form hard mask structures 1260 on the top surface of layer 1250, as illustrated in FIG. 12 (act 1105). In one implementation, hard mask layer may be formed to a thickness ranging from about 400 Å to about 1,000 Å and may include a dielectric material, such as SiRN, SiN, SiON, etc. Hard mask structures 1260 may be used to facilitate etching of layer 1250, as described in more detail below. In one implementation, hard mask structures 1260 may be formed to a width ranging from about 800 Å to about 1,300 Å.

Figure 13:
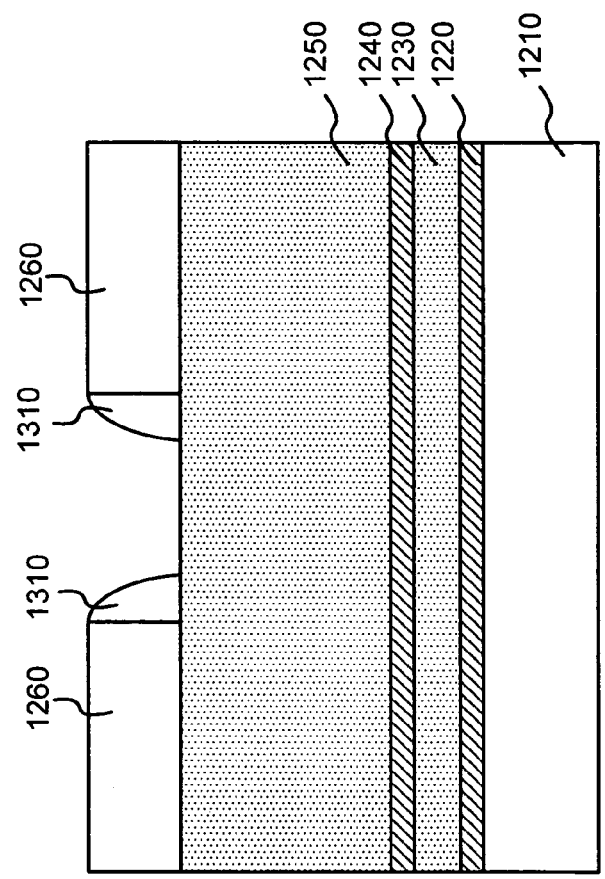

Spacers 1310 may be formed adjacent the sidewalls of hard mask structures 1260, as illustrated in FIG. 13 (act 1110). For example, a dielectric material, such as a silicon oxide, a silicon rich nitride, a silicon nitride, a silicon oxynitride, or another dielectric material, may be deposited and etched to form spacers 1310 on the side surfaces of hard mask structures 1260, as illustrated in FIG. 13. Spacers 1310 may be used for etching layer 1250, as will be described below.

Figure 14:
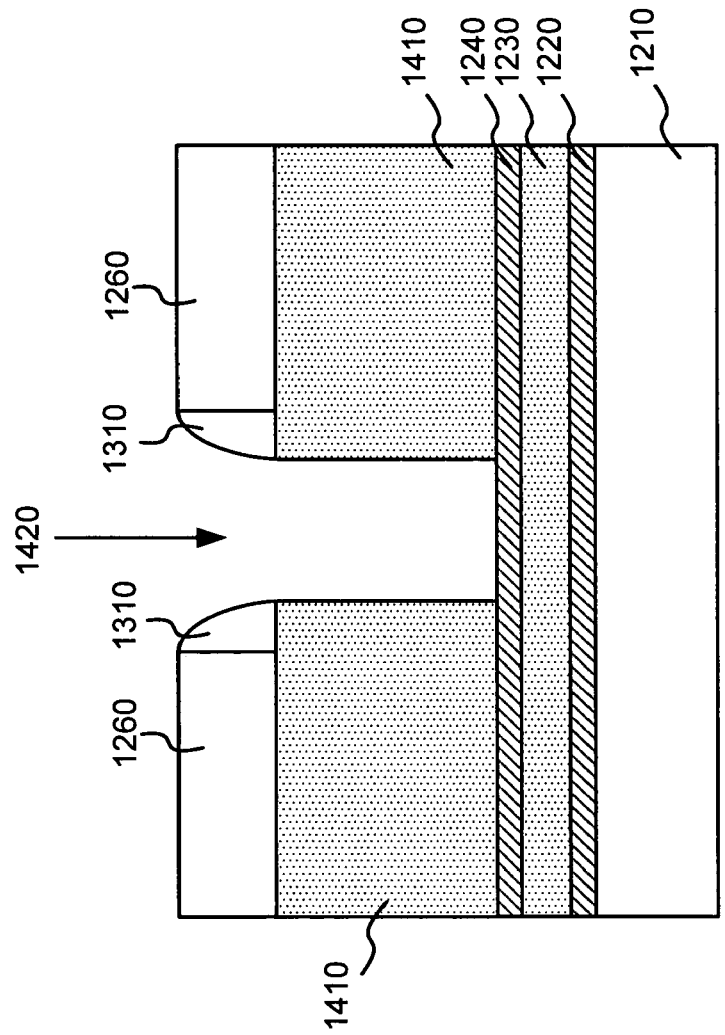

Semiconductor device 1200 may then be etched, as illustrated in FIG. 14 (act 1115). Referring to FIG. 14, layer 1250 may be etched in a conventional manner with the etching terminating at layer 1240, thereby forming structures 1410. Each structure 1410 may be formed to a width ranging from about 1,200 Å to about 2,000 Å. In an implementation consistent with the principles of the invention, a gap (or trench) 1420 formed between structures 1410 may range from about 500 Å to about 1,000 Å in width. In one implementation, gap 1420 may be formed to a width of less than 100 nm, such as approximately 90 nm.

Figure 15:
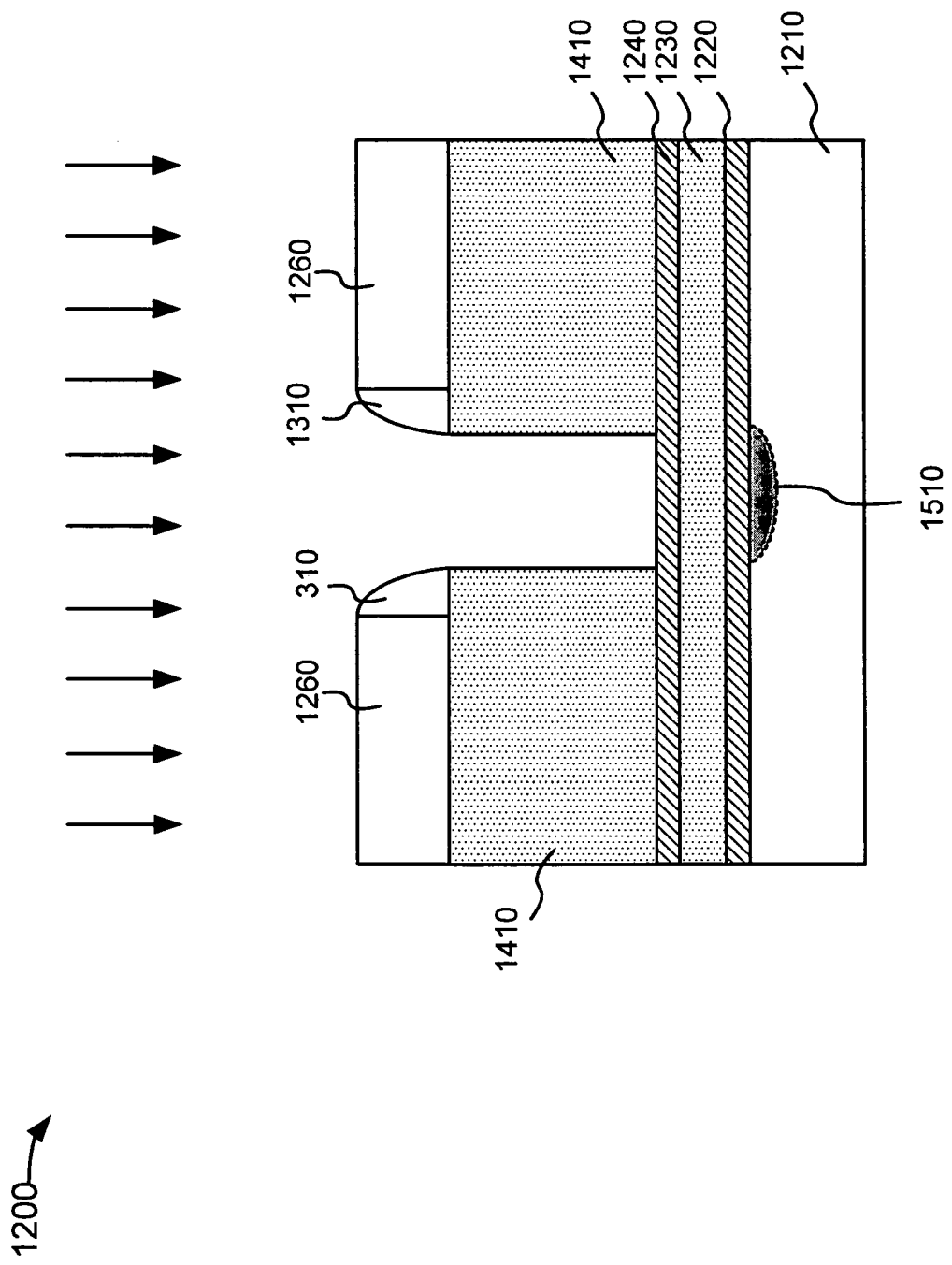

A bit line implant may be performed, as illustrated in FIG. 15, to form bit line 1510 (act 1120). In one implementation, bit line 1510 may be formed by a main perpendicular implant process into substrate 1210. Unlike conventional implant processes, the implant process, according to an exemplary implementation consistent with the principles of the invention, may be performed as a lower concentration implant. For example, in one implementation, a p-type dopant, such as boron, may be used as the dopant. An n-type dopant, such as arsenic or phosphorous, may be used as the dopant. The n-type dopant atoms may be implanted at a dosage of about $1\times10^{12}$ atoms/$cm^2$ to about $1\times10^{15}$ atoms/$cm^2$ and an implantation energy of about 40 KeV to about 60 KeV, which may depend on the desired junction depth for bit line 1510.

Figure 16:
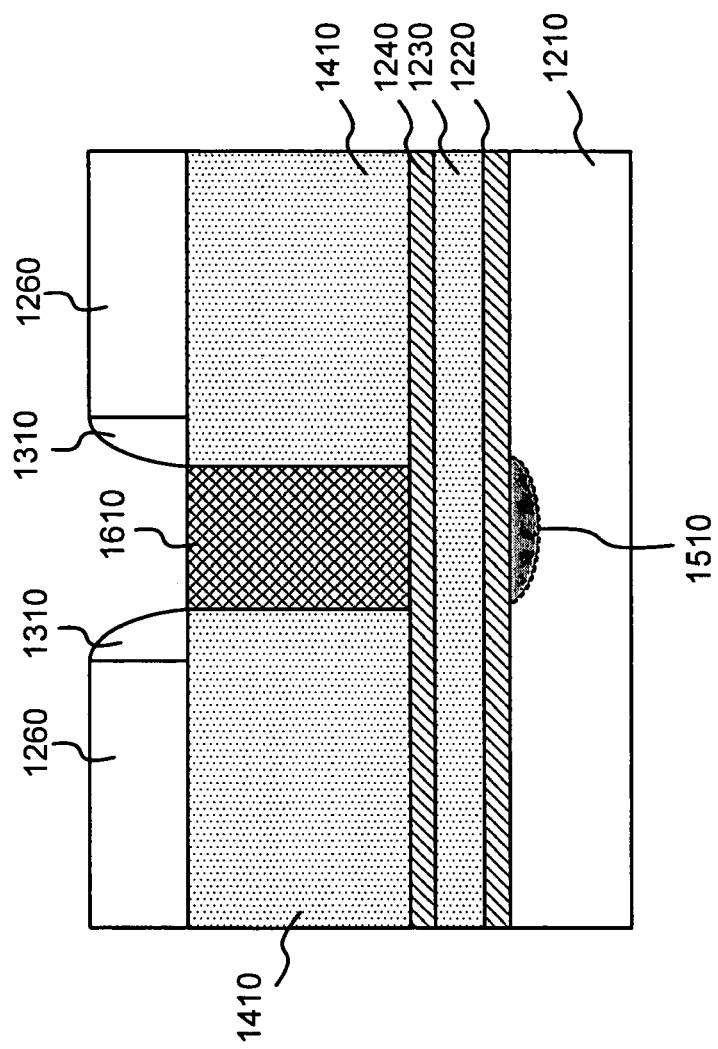
Figure 17:
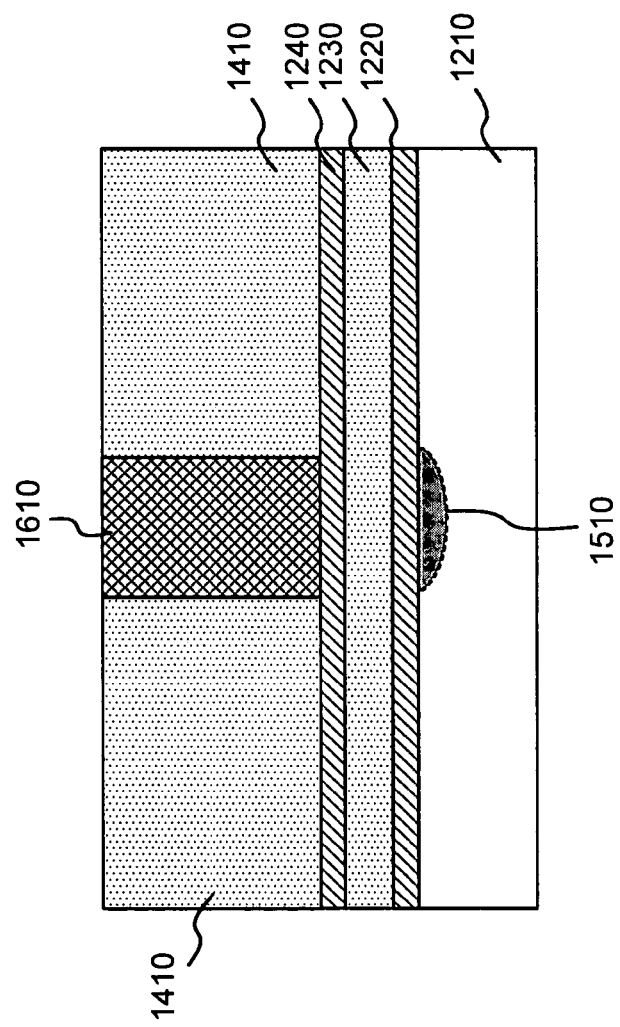

Following the bit line implant, gap 1420, formed between structures 1410, may be filled with a material 1610, as illustrated in FIG. 16 (act 1125). In one implementation, material 1610 may include an HDP oxide or another dielectric material. Material 1610 may be polished back to the top surface of structures 1410. Hard mask structures 1260 and spacers 1310 may be removed, as illustrated in FIG. 17 (act 1125).

Figure 18:
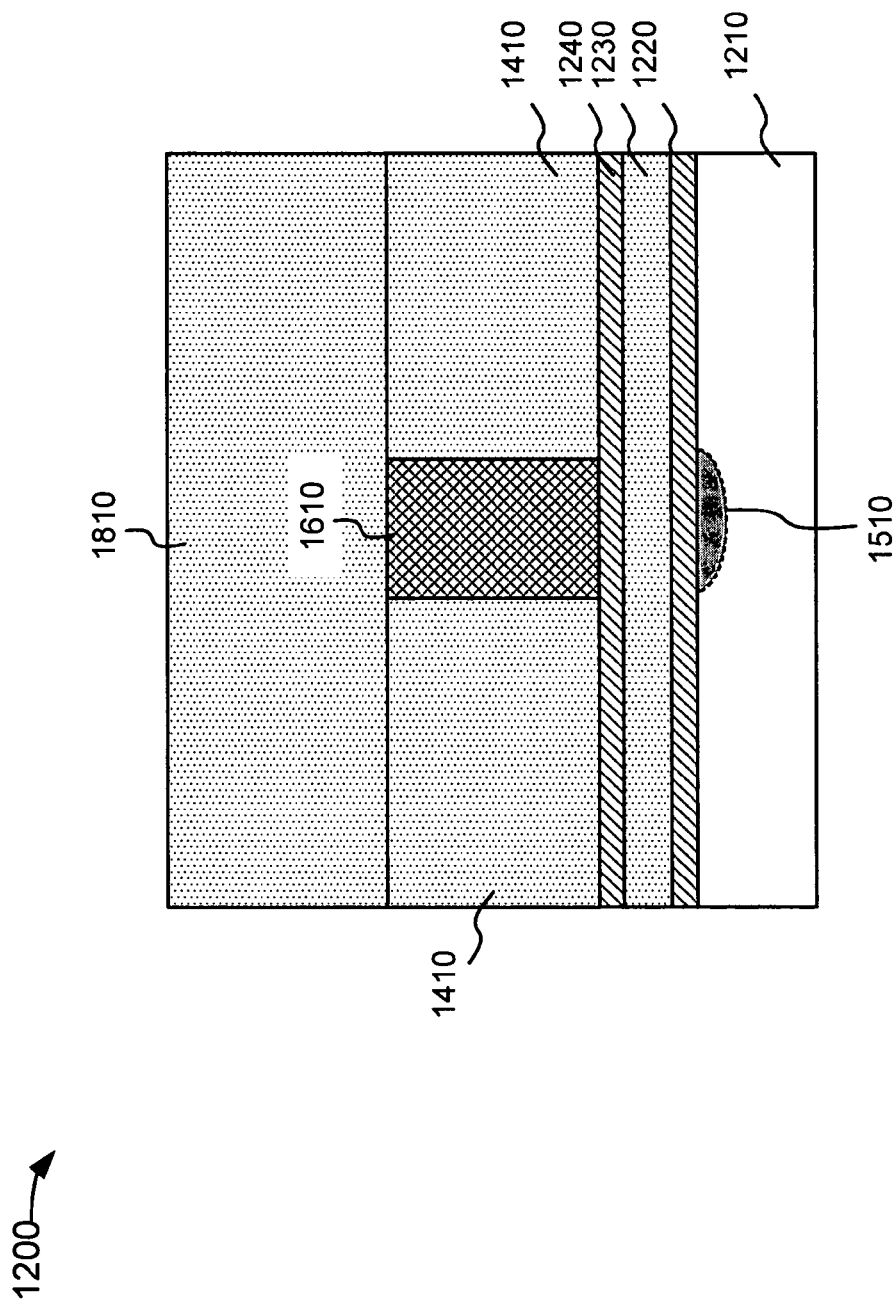

A conductive layer 1810 may be formed on a top surface of semiconductor device 1200 in a conventional manner, as illustrated in FIG. 18 (act 1130). In one implementation consistent with the principles of the invention, conductive material 1810 may include polycrystalline silicon. Alternatively, layer 1810 may include other semiconducting materials, such as germanium or silicon-germanium, or various metals, such as titanium or tungsten. Layer 1810, consistent with an implementation of the invention, may serve as a word line for semiconductor device 1200. In an exemplary implementation, layer 1810 may be formed to a thickness ranging from about 800 Å to about 1,200 Å. An optional silicide layer, such as titanium silicide (not shown), may be formed on layer 1810.

Various BEOL processing may be performed to complete the fabrication of semiconductor device 1200. For example, one or more ILDs, conductive lines, and contacts may be formed in semiconductor device 1200. A top dielectric layer, also referred to as cap layer, may be formed over the top most conductive layer and may act as a protective layer to prevent damage to semiconductor device 1200, such as to protect against impurity contamination during subsequent cleaning processes that may be used to complete a working memory device. The working memory device may include a large number of memory cells, where each memory cell is able to store one or more bits of information. For example, charge storage layer 1230 for each memory cell may store 2 or more charges by localizing charges caused by electrons tunneling into layer 1230 during programming. In this manner, the density of semiconductor device 1200 may be increased.

Thus, in implementations consistent with the principles of the invention, bit line implants may be performed with a lower concentration of dopants. Moreover, the effective channel length is improved as a result of the above processing. For example, using spacers, such as spacers 310 and 510 or spacers 1310 enables the bit lines to be formed away from channel regions of memory cells in semiconductor devices 200 and 1200. Advantageously, forming the bit line implants in more targeted or smaller regions results in bit lines not diffusing into channel regions during subsequent processing, such as thermal annealing. This enables the memory cells in devices 200 and 1200 to be formed with the desired channel length.

CONCLUCION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 1 and 11, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method of performing a bit line implant, the method comprising:
   forming a first structure and a second structure on an oxide-nitride-oxide stack on a substrate of a semiconductor device, the first structure and the second structure each including a polysilicon portion and a hard mask portion, the hard mask portions including opposing sidewalls, wherein the first structure and the second structure are separated by a gap having a width ranging from about 500 to about 1,000 Å;
   forming a first spacer adjacent a sidewall of the hard mask portion of the first structure and a second spacer adjacent a sidewall of the hard mask portion of the second structure;
   etching, using the first and second spacers, the oxide-nitride-oxide stack to form a trench to a width ranging from about 40 to about 70 nanometers to expose a top surface of a portion of the substrate; and
   implanting, in the trench, a dopant at a dosage ranging from about $1\times10^{12}$ atoms/cm$^2$ to about $1\times10^{15}$ atoms/cm$^2$ and an implantation energy ranging from about 5 KeV to about 30 KeV.

2. The method of claim 1 wherein the forming a first structure and a second structure includes:
   forming the hard mask portion to a thickness ranging from about 400 Å to about 1,000 Å, and
   forming the polysilicon portion to a thickness ranging from about 500 Å to about 1,200 Å.

3. The method of claim 2 wherein the forming a first structure and a second structure includes:
   forming the hard mask portion to a width ranging from about 800 Å to about 1,600 Å, and
   forming the polysilicon portion to a width ranging from about 1,000 Å to about 1,800 Å.

4. The method of claim 1 wherein the trench is formed to a width ranging from about 40 nanometers to about 50 nanometers.

5. A semiconductor device comprising:
   an oxide-nitride-oxide stack formed on a substrate,
   first conductive structures formed on the oxide-nitride-oxide stack, the first conductive structures serving as a bit line implant blocker, the first conductive structures having facing sidewalls separated by less than 100 nanometers from each other;
   a second conductive layer formed on the first conductive structures, the second conductive layer serving as a word line;
   spacers formed along the facing sidewalls of the first conductive structures to a thickness from about 100 Å to about 250 Å; and
   a high density plasma oxide formed in a gap between the spacers, the gap being of a thickness from about 40 nanometers to about 70 nanometers.

6. A method comprising:
   forming a polysilicon layer on an oxide-nitride-oxide stack on a substrate;
   forming hard mask structures on the polysilicon layer, the hard mask structures including sidewalls facing each other;
   forming first sidewall spacers adjacent to the facing sidewalls of the hard mask structures;
   etching the polysilicon layer using the first sidewall spacers to form a first polysilicon structure with a first sidewall and a second polysilicon structure with a second sidewall and to expose a top surface of the oxide-nitride-oxide stack, the first polysilicon structure being separated by a distance less than 100 nanometers apart from the second polysilicon structure, the first and second sidewalls face each other;
   forming second sidewall spacers adjacent to the first and second sidewalls;
   etching the oxide-nitride-oxide stack using the first sidewall spacers and the second sidewall spacers to form a trench to expose the substrate, the trench being formed to a width ranging from about 40 nanometers to about 70 nanometers; and
   performing a bit line implant in the trench.

7. The method of claim 6, the performing a bit line implant further comprising:
   implanting a dopant at a dosage ranging from about $1\times10^{12}$ atoms/cm$^2$ to about $1\times10^{15}$ atoms/cm$^2$ and an implantation energy ranging from about 5 KeV to about 30 KeV in the trench.

8. The method of claim 6 wherein the hard mask structures comprise a silicon rich nitride, a silicon nitride, or a silicon oxynitride.

9. The method of claim 6 wherein the forming the plurality of hard mask structures includes:
   forming the hard mask structures-to a thickness ranging from about 400 Å to about 1,000 Å, and
   where the forming the polysilicon layer includes:
   forming the polysilicon layer to a thickness ranging from about 500 Å to about 1,200 Å.

10. The method of claim 9 wherein the etching the polysilicon layer includes:

forming the first and second polysilicon structures each to a width ranging from about 1,000 Å to about 1,800 Å.

11. The method of claim 6 wherein the trench is formed to a width ranging from about 40 nanometers to about 50 nanometers.

12. The method of claim 6 further comprising:

filling, after the bit line implant, the trench with an oxide using a high density plasma process.

13. The method of claim 12 further comprising:

forming, after the filling, a word line above the first and second polysilicon structures.

\* \* \* \* \*